(12) United States Patent
Jiang et al.

(10) Patent No.: US 8,892,377 B2
(45) Date of Patent: Nov. 18, 2014

(54) DIGITAL PROGRAMMABLE LOAD MEASUREMENT DEVICE

(75) Inventors: Shyh-Biau Jiang, Jung-li (TW); Hui-Pu Chang, Jung-li (TW)

(73) Assignee: National Central University, Jung-Li, Taoyuan (TW)

( * ) Notice: Subject to any disclaimer, the term of this patent is extended or adjusted under 35 U.S.C. 154(b) by 606 days.

(21) Appl. No.: 13/222,998

(22) Filed: Aug. 31, 2011

(65) Prior Publication Data

US 2013/0054155 A1 Feb. 28, 2013

(51) Int. Cl.
*G01R 19/00* (2006.01)
*G01R 31/28* (2006.01)
*G01R 1/20* (2006.01)
*G01R 31/26* (2014.01)

(52) U.S. Cl.
CPC ........ *G01R 31/2836* (2013.01); *G01R 31/2603* (2013.01); *G01R 1/203* (2013.01)
USPC .............................. 702/64; 702/117; 341/154

(58) Field of Classification Search
CPC ......... H03M 1/785; H03M 1/78; H03M 1/66; H03M 1/12; H03M 1/1205; H03M 1/808; G01R 1/203; G01R 31/2834
See application file for complete search history.

(56) References Cited

U.S. PATENT DOCUMENTS

| 4,456,880 A | 6/1984 | Warner et al. |
| 5,512,831 A | 4/1996 | Cisar et al. |
| 7,015,847 B1 * | 3/2006 | McLachlan et al. .......... 341/145 |

* cited by examiner

*Primary Examiner* — Mischita Henson
(74) *Attorney, Agent, or Firm* — Muncy, Geissler, Olds & Lowe, P.C.

(57) ABSTRACT

A digital programmable load measurement device provides a controllable and variable load unit in a system. The variable load unit is connected to a voltage follower and a current follower to measure and figure out dynamic load voltage and load current of a device under test. Selected loads can be switched in a short period to measure the voltage and current values thereof, sampled for saving, and an I-V curve of the system can be depicted.

4 Claims, 7 Drawing Sheets

DIGITAL PROGRAMMABLE LOAD MEASUREMENT DEVICE

FIELD OF THE INVENTION

The present invention relates to a digital programmable load (DPL in short hereinafter) measurement device and particularly to a DPL measurement device adopted for use on a power system to rapidly measure and figure out voltage and current parameters.

BACKGROUND OF THE INVENTION

With advanced development and wide utilization of power energy resources, assessing good or bad condition of a power system becomes increasingly important. For instance, parameters such as voltage and current are the most important reference for solar cells, zinc-air batteries and the like. By measuring variations of the voltage and current of the power system in different loads, an I-V curve can be obtained and served as an important reference to observe energy consumption and element characteristics of the power system.

In the past, measuring current-voltage characteristics of the power system mainly uses resistor as a load. By changing resistance the voltage-current characteristics of the power system in different loads can be obtained. However, to do measurement by changing different resistors takes a lot of time. Moreover, variable resistor generally cannot withstand temperature effect caused by great current. This limits measurable power system specifications. Moreover, the number of resistors increases rapidly with accuracy demand but becomes difficult to realize on smaller volume of loads.

Since variable resistor load is difficult to implement in practice, some conventional techniques try to get variable loads by incorporating resistors with analog circuits, or employing capacitor charge and discharge approach. However, the two approaches mentioned above need a basic duty frequency which restricts the degree of sampling frequency taken by users. This is because the sampling frequency must be much lower than the basic duty frequency of a simulated load so as to ignore impact of modulation of the basic duty frequency.

U.S. Pat. No. 4,456,880 entitled "I-V Curve Tracer Employing Parametric Sampling" employs a switched-capacitor resistor to do charging and discharging, and digital sampling of output voltage and current. However, using the switched-capacitor generates a basic duty frequency in the system. U.S. Pat. No. 5,512,831 entitled "Method and Apparatus for Testing Electrochemical Energy" employs a parallel field effect transistor (FET) as a load, and through a digital feedback approach to control output current of a measurement system. The digital feedback frequency is the basic duty frequency of the system.

In order to implement a real variable resistor load and overcome the constraint of the basic duty frequency, the present invention employs an R-2R resistor network to realize the variable resistor load and an operational amplifier incorporating with a power transistor to perform analog feedback control. As the analog feedback control does not need sampling, there is no basic duty frequency and the related bandwidth limitation, hence a greater stable range can be achieved.

SUMMARY OF THE INVENTION

Therefore, the primary object of the present invention is to provide a DPL measurement device that provides a variable load switching to various desired load values in a short period to measure individual voltage and current signals and prevent energy loss and temperature effect of a device under test.

Another object of the invention is to control the measurement device through a digitized approach with digital input to control load switching of entire measurement device and scan to obtain an I-V curve.

To achieve the foregoing objects, the present invention provides a digital programmable load (DPL) measurement device which includes an R-2R ladder network, a voltage follower and a current follower. The R-2R ladder network is electrically connected to the voltage follower and current follower. The R-2R ladder network can generate a variable and adjustable load. The voltage follower and current follower form a loop with the variable and adjustable load and a device under test to measure voltage and current values, and also avert great current to protect the measurement device. Thus the invention can separate the device under test in a power system and the measurement device. In the event that a great current is output from the device under test the current in the measurement device can be adjusted lower to avoid damaging elements caused by high temperature resulting from the excessive current, and the problem of thermal effect can be reduced.

The foregoing, as well as additional objects, features and advantages of the invention will be more readily apparent from the following detailed description, which proceeds with reference to the accompanying embodiments and drawings. The embodiments serve merely for illustrative purpose and are not the limitation of the invention.

DETAILED DESCRIPTION OF THE PREFERRED EMBODIMENTS

Figure 1:
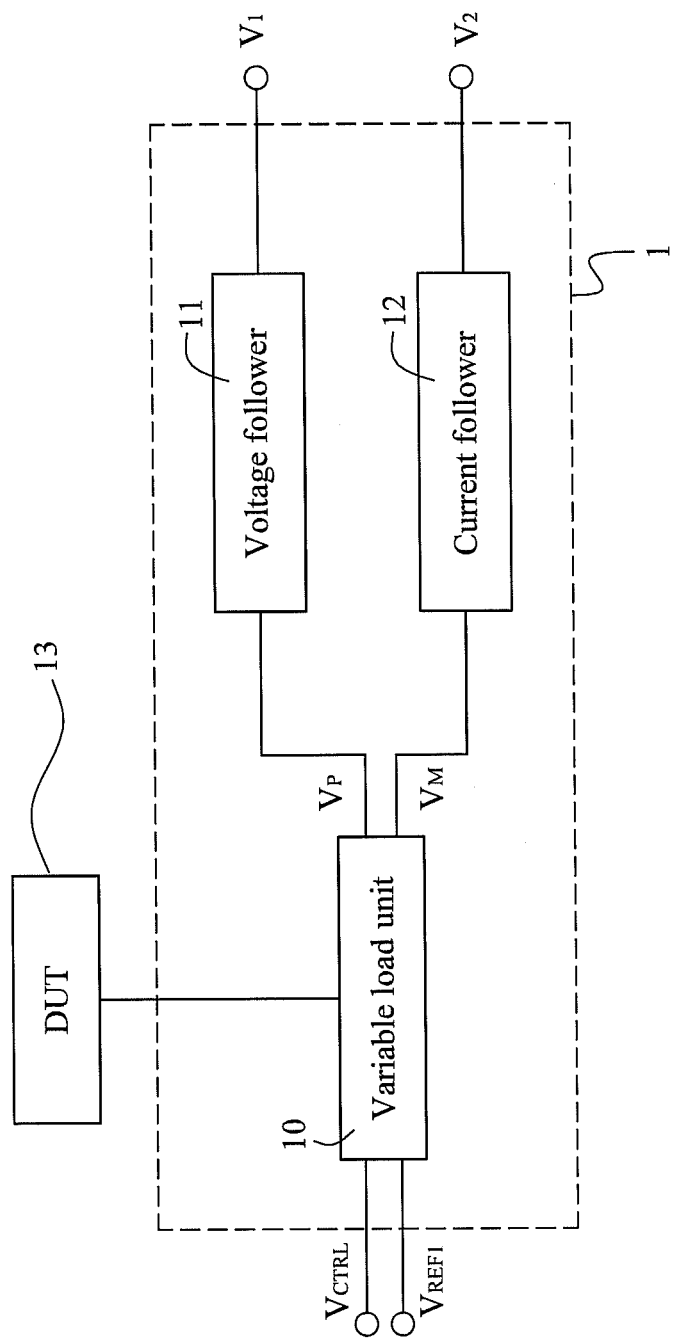
FIG. 1 is a block diagram of an embodiment of the DPL measurement device of the invention.

Please refer to FIG. 1, the DPL measurement device 1 according to the invention comprises a variable load unit 10, a voltage follower 11 and a current follower 12. A device under test (DUT in short hereinafter) 13 is externally connected to the variable load unit 10. By inputing a control signal $V_{CTRL}$ to the variable load unit 10, the load resistance of the DUT 13 can be adjusted. The voltage follower 11 is electrically connected to the variable load unit 10. The voltage follower 11 measures a first signal $V_1$ of output voltage under the load resistance without increasing additional load. The current follower 12 also is electrically connected to the variable load unit 10, and a second signal $V_2$ can be measured without increasing additional load to figure out the corresponding output current of the DUT 13.

Figure 2:
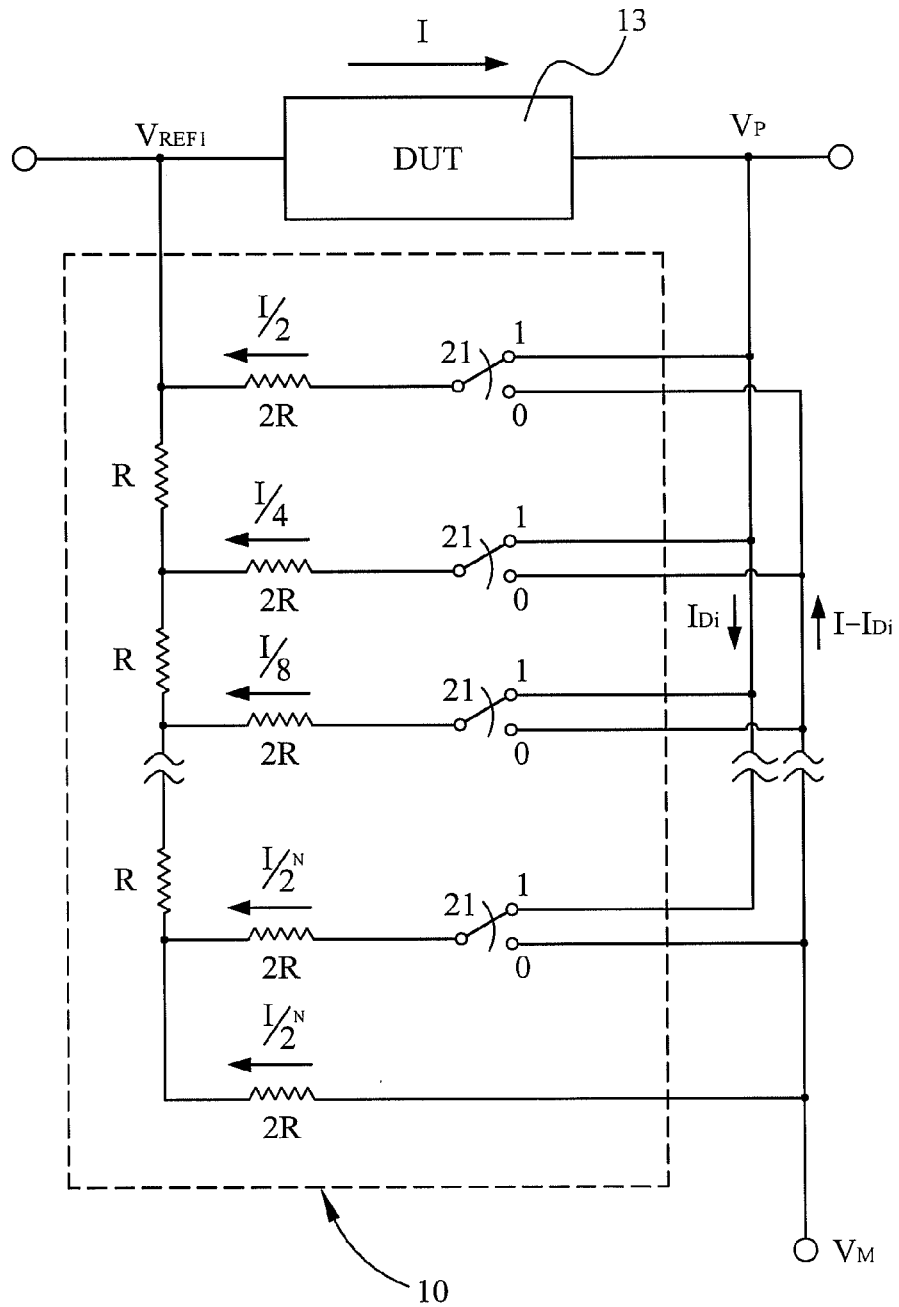
FIG. 2 is a circuit diagram of an embodiment of the R-2R ladder network of the invention.

Referring to FIG. 2, the variable load unit 10 includes an R-2R ladder network 20 which comprises a plurality of resistors R and 2R and a plurality of switches 21. The resistors include N−1 first resistors R and N+1 second resistors 2R. The second resistor 2R has resistance twice the first resistor R, hence the first resistor is denoted as R and the second resistor is denoted as 2R. Each first resistor R has two ends electrically connected to two second resistors 2R (total number is N). The other ends of the N second resistor 2R are electrically connected to one of the switches 21. As the total number of the second resistors 2R is N+1, the last second resistor 2R is connected to the first resistors R in series and also connected to a measured output signal $V_M$.

The R-2R ladder network 20 operates according to the principle as follow: the DUT 13 has one end receiving a first reference signal $V_{REF1}$ and the other end generating a distal end signal $V_P$. The external control signal $V_{CTRL}$ (as shown in FIG. 1) controls every switch 21 to selectively whether connect to the distal end signal $V_P$. Thereby the load resistance at the DUT 13 can be changed and a load signal $V_L$ can be determined. The load signal $V_L$ is the difference of the distal end signal $V_P$ and the first reference signal $V_{REF1}$, i.e. $V_L = (V_P - V_{REF1})$.

Based on the switch mode of the switch 21, the load resistance at the DUT 13 can be determined. Assumed that the load resistance is $R_O$ and total current value flowing into the DUT 13 is I, according to current division principle, the following equations can be derived:

$$I = (V_P - V_{REF1})/R_O = V_L/R_O \qquad (1)$$

$$I_{Di} = I \times n/2^N \qquad (2)$$

$$= (I - I_{Di}) \times n/(2^N - n) \qquad (3)$$

wherein $n = 2^0 b_0 + 2^1 b_1 + 2^2 b_2 + \ldots + 2^{N-1} b_{N-1}$,
$b_i$ is 1 representing the ith switch connected to the distal end signal $V_P$; otherwise it is 0.

On equation (2), $I_{Di}$ is the load current value flowing from the distal end signal $V_P$ of the DUT 13 through ith and i+1 second resistors 2R. I subtracts $I_{Di}$ represents I-$I_{Di}$ which is the complementary current of current $I_{Di}$. According to equation (1), the direction of current I flowing through the DUT 13 is determined by the relative voltage of the first reference signal $V_{REF1}$ and the distal end signal $V_P$. Switching of the switch 21 determines the load resistance of the DUT 13. According to the equations set forth above, if all the switches 21 are connected to the distal end signal $V_P$, then the current flowing through the 0th second resistor 2R (most close to the DUT 13) is I/2, the current flowing through the 1st second resistor 2R is I/4, and so forth. The current at the last two sets of the second resistor 2R (most far from the DUT 13) is $I/2^N$ as denoted on every second resistor 2R in FIG. 2.

Figure 3B:
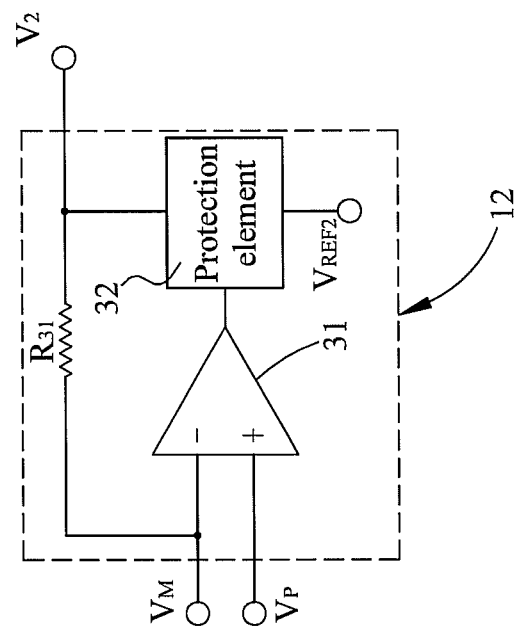
FIG. 3B is a circuit diagram of an embodiment of the current follower of the invention.
Figure 3A:
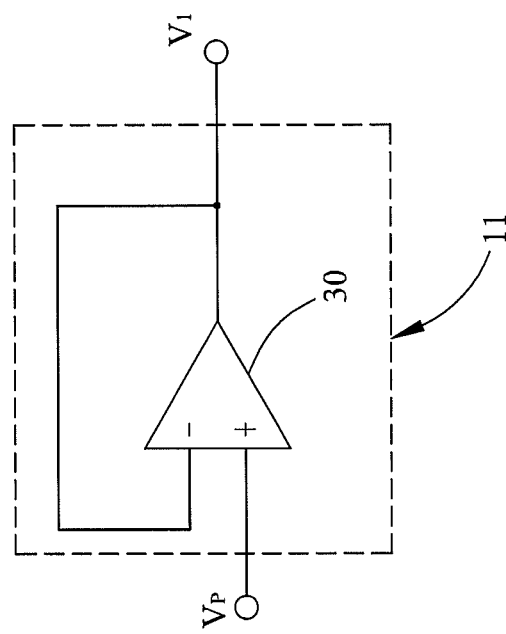
FIG. 3A is a circuit diagram of an embodiment of the voltage follower of the invention.

Referring to FIGS. 3A and 1, the voltage follower 11 of the DPL measurement device 1 includes a voltage amplifier 30 which has a non-inverted input end to receive the distal end signal $V_P$ from the variable load unit 10, and an inverted input end to receive feedback of the first signal $V_1$ output from the voltage amplifier 30. By measuring the first signal $V_1$ output from the voltage amplifier 30, the value of the distal end signal $V_P$ of the variable load unit 10 can be obtained to further derive the load signal $V_L$.

Referring to FIGS. 3B and 1, the current follower 12 includes a current amplifier 31 and a current-limiting resistor $R_{31}$. The current amplifier 31 has a non-inverted input end to receive the distal end signal $V_P$ from the variable load unit 10, and an inverted input end to get feedback of the second signal $V_2$ from the output end of the current follower 12 and then connect with the current-limiting resistor $R_{31}$ in series to input. According to Ohm's law, through the voltage difference at two ends of the current-limiting resistor $R_{31}$, the current value flowing through the current-limiting resistor $R_{31}$ can be figured out, and also the current value is equivalent to the complementary current I-$I_{Di}$ mentioned above. As shown in FIG. 3, the voltages at two ends of the current value resistor $R_{31}$ are the second signal $V_2$ and measured output signal $V_M$. As the load signal $V_L$ has already been obtained from the aforesaid voltage follower 11, the value of the second signal $V_2$ can be measured in the current follower 12 to figure out the load current $I_{Di}$.

Moreover, in order to prevent excessive current from flowing into the current follower 12 to cause damage, a protection element 32 may be included and electrically connected to the output end of the current follower 12, and a second reference signal $V_{REF2}$ is input to the protection element 32.

Figure 4:
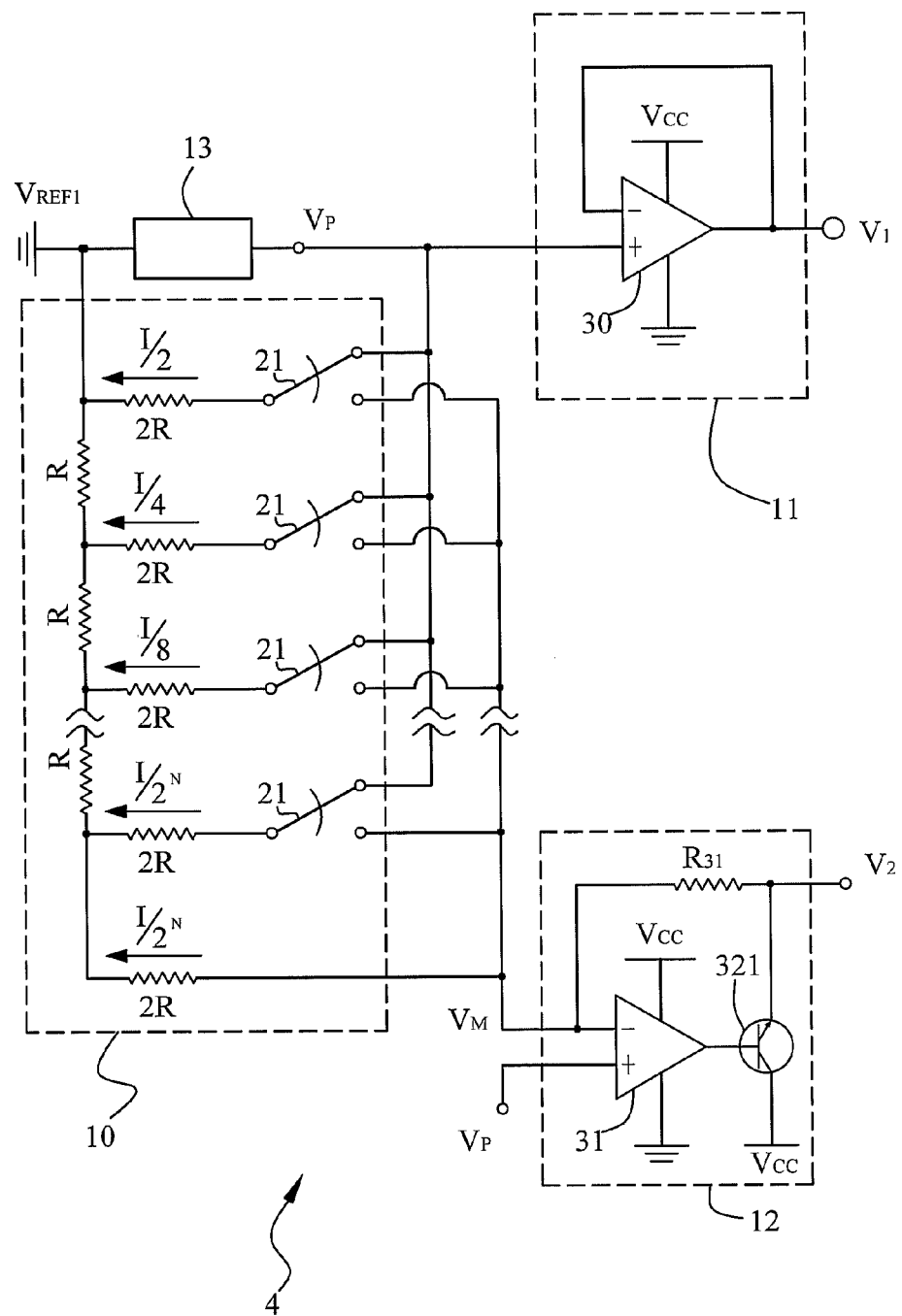
FIG. 4 is a circuit diagram of an embodiment of the common-cathode DPL measurement device according to the invention.

Refer to FIG. 4 for an embodiment of the DPL measurement device of the invention. The first reference signal $V_{REF1}$ of the variable load unit 10 is connected to a low voltage level, such as ground, and the second reference signal $V_{REF2}$ of the current follower 12 is connected to a high voltage level Vcc, thus forms a common-cathode DPL measurement device 4. In the current follower 12, the protection element 32 may be an NPN bipolar transistor 321 with a base electrically connected to the output end of the current amplifier 31 and with a collector connected to the second reference signal $V_{REF2}$ at the high voltage level Vcc mentioned above.

The DPL measurement device 4 thus formed has a common-cathode circuit to measure the load voltage and load current of the DUT 13. Adopted the same principle, a common-anode circuit can also be adopted to meet different requirements.

Figure 5:
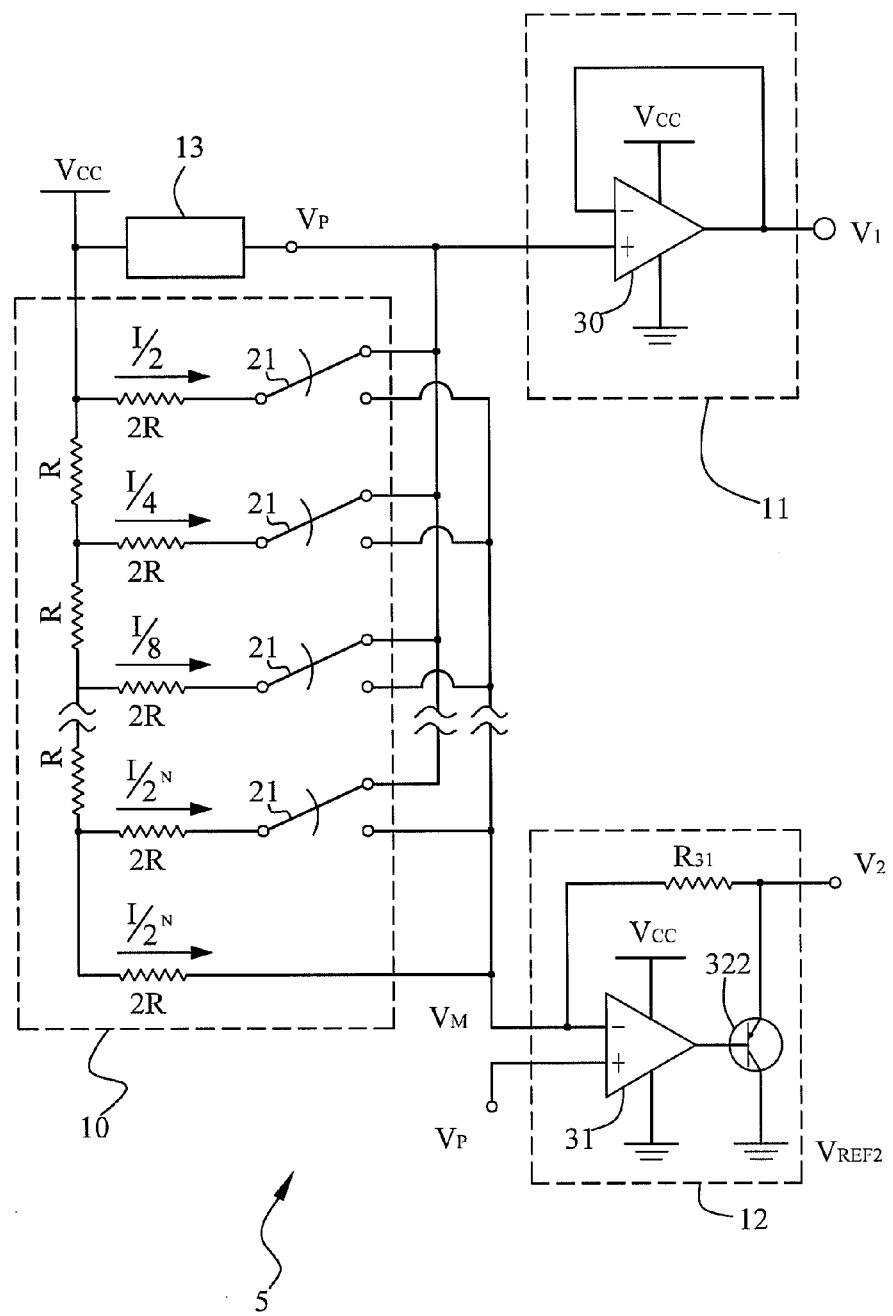
FIG. 5 is a circuit diagram of an embodiment of the common-anode DPL measurement device according to the invention.

Referring to FIG. 5, the first reference signal $V_{REF1}$ of the variable load unit 10 can be connected to a high voltage level Vcc and the second reference signal $V_{REF2}$ of the current follower 12 can be connected to a low voltage level such as ground to form a common-anode DPL measurement device 5. In the current follower 12, the protection element 32 may be a PNP bipolar transistor 322 with a base electrically connected to the output end of the current amplifier 31 and with an emitter electrically connected to the second reference signal $V_{REF2}$, i.e. ground.

Figure 6:
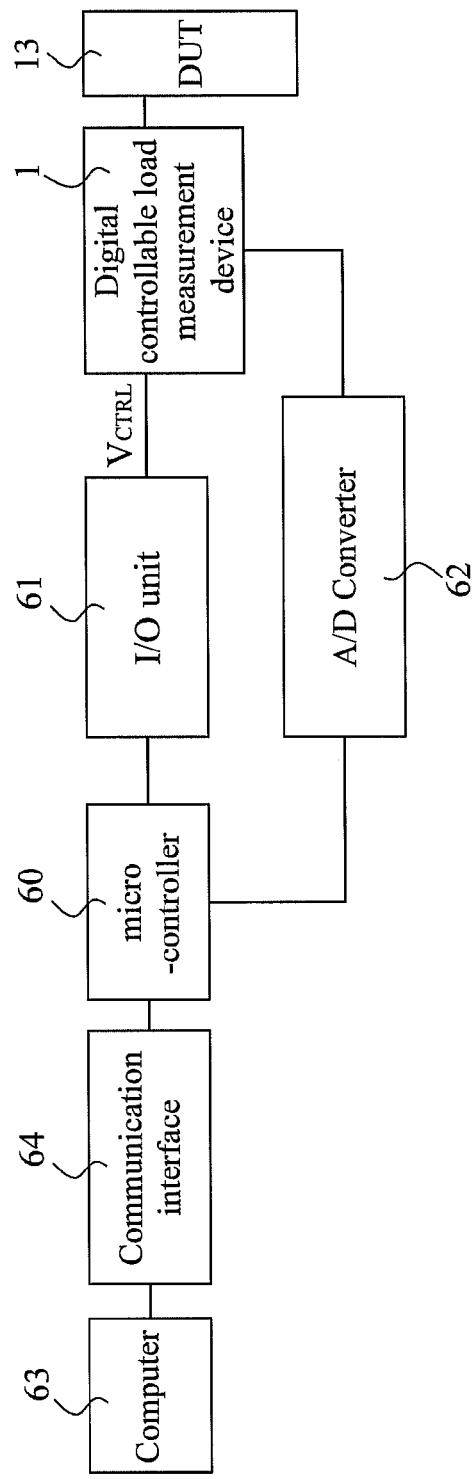
FIG. 6 is a schematic view of a measurement system of an embodiment of the invention in a use condition.

Refer to FIG. 6 for an embodiment of the measurement system of the invention. It comprises a micro-controller 60, an I/O unit 61, the DPL measurement device 1 and an analog to digital converter (A/D in short) 62. A computer 63 is provided to transmit signals to the micro-controller 60 through a communication interface 64. The micro-controller 60 receives the signals and outputs an external control signal $V_{CTRL}$ through the I/O unit 61 so that the DPL measurement device 1 can selectively provide a variable load or a constant load to the DUT 13. Because of the load, the DUT 13 outputs an analog signal back to the DPL measurement device 1. The analog signal is converted by the A/D converter 62 to become a digital signal sent back to the micro-controller 60 which in turn sends back to the computer 63 via the communication interface 64.

Figure 7:
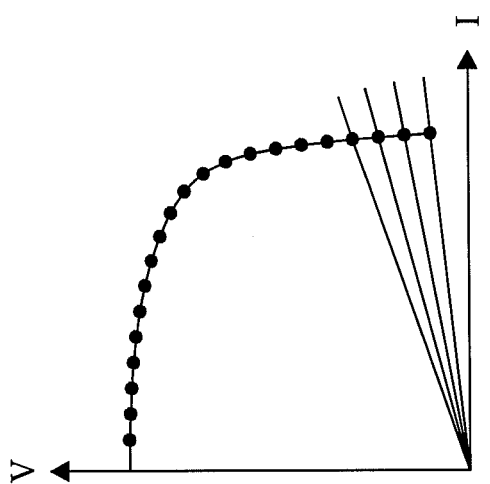
FIG. 7 is a chart showing an I-V curve of a device under test.

After the computer 63 has received the digital signal, saving as records and denoting the measured voltage and current signals on the coordinates in an I-V curve at measured points as indicated by black dots in FIG. 7. Linking the measured points, an I-V curve of the element can be depicted as shown in FIG. 7, which represents linear constant load lines by fine black straights.

As a conclusion, the present invention can select a variable load or a constant load, and can automatically measure and depict an I-V curve of an element in a short period without adjusting each variable load individually, and can also record measurement data. The DUT 13 mentioned in the invention may be a general electronic element such as a solar panel, transistor, diode and the like.

While the invention has been described by means of specific embodiments, numerous modifications and variations could be made thereto by those skilled in the art without departing from the scope and spirit of the invention set forth in the claims.

What is claimed is:

1. A digital programmable load measurement device, comprising:
    an R-2R ladder network which includes a plurality of resistors and a plurality of switches, the R-2R ladder network controlling connection of each switch and the corresponding resistor through an external control signal to determine a load resistance of a device under test;
    a voltage follower which is electrically connected to the R-2R ladder network to obtain a load signal of the device under test, wherein the voltage follower includes a voltage amplifier, the device under test including two ends formed at voltages defined respectively a first reference signal and a distal end signal, the voltage amplifier including an non-inverted input end and an inverted input end, the voltage amplifier outputting feedback to the inverted input end thereof and the non-inverted input end receiving the distal end signal of the device under test, the load signal of the device under test being obtained through a first signal output from the voltage follower; and
    a current follower which is electrically connected to the R-2R ladder network to obtain a load current of the device under test, wherein the current follower includes a current amplifier and a current-limiting resistor, the current follower including an non-inverted input end and an inverted input end, the current follower outputting feedback through the current-limiting resistor to the inverted input end thereof and the non-inverted input end receiving the distal end signal of the device under test, the inverted input end being electrically connected to a measured output signal of the R-2R ladder network, the load current of the device under test being obtained through a second signal output from the current follower.

2. The digital programmable load measurement device of claim 1, wherein the current follower further includes a protection element to prevent excessive current from flowing through the current follower.

3. The digital programmable load measurement device of claim 2, wherein the protection element is an NPN bipolar transistor which includes a base connected to an output end of the current amplifier and a collector connected to a high voltage level, the first reference signal of the device under test being connected to a low voltage level to form a common-cathode circuit.

4. The digital programmable load measurement device of claim 2, wherein the protection element is a PNP bipolar transistor which includes a base connected to an output end of the current amplifier and an emitter connected to a low voltage level, the first reference signal of the device under test being connected to a high voltage level to form a common-anode circuit.

* * * * *